United States Patent
Mathew et al.

[11] Patent Number: 5,897,343
[45] Date of Patent: Apr. 27, 1999

[54] METHOD OF MAKING A POWER SWITCHING TRENCH MOSFET HAVING ALIGNED SOURCE REGIONS

[75] Inventors: Leo Mathew, Chandler; Keith G. Kamekona, Scottsdale; Huy Trong Tran; Prasad Venkatraman, both of Gilbert; Jeffrey Pearse, Chandler, all of Ariz.; Bich-Yen Nguyen, Austin, Tex.

[73] Assignee: Motorola, Inc., Schaumuburg, Ill.

[21] Appl. No.: 09/050,164

[22] Filed: Mar. 30, 1998

[51] Int. Cl.[6] .................................................. H01L 21/332
[52] U.S. Cl. ............................ 438/133; 438/138; 438/270
[58] Field of Search ..................................... 438/133, 135, 438/136, 137, 138, 140, 268, 269, 270, 271

[56] References Cited

U.S. PATENT DOCUMENTS

| | | | |
|---|---|---|---|
| 4,971,929 | 11/1990 | D'Anna et al. .......................... | 438/309 |
| 5,527,720 | 6/1996 | Goodyear et al. ....................... | 438/270 |
| 5,624,855 | 4/1997 | Sumida ..................................... | 438/589 |
| 5,689,128 | 11/1997 | Hshieh et al. ........................... | 257/331 |
| 5,723,376 | 3/1998 | Takeuchi et al. ........................ | 438/931 |
| 5,770,514 | 6/1998 | Matsuda et al. ......................... | 438/589 |

*Primary Examiner*—Tuan H. Nguyen
*Attorney, Agent, or Firm*—Robert D. Atkins; Lanny L. Parker

[57] ABSTRACT

A trench power switching transistor (10) is fabricated having sub-micron features on a body layer (26) without using sub-micron lithography. An opening in a field oxide layer (28) defines an area for implanting a source region (30) in the body layer (26) that is self-aligned to a first edge (28A) and a second edge (28B) of the field oxide layer (28). Sidewall spacers (32) are formed in accordance with the first and second edges (28A and 28B) of the field oxide layer (28). A trench is aligned to the sidewall spacers (32) and formed centered within the source region (30). An implant layer (42) formed between sections of the power switching transistor (10) is aligned to the sidewall spacers (32) at the first and second edges (28A and 28B).

7 Claims, 2 Drawing Sheets

METHOD OF MAKING A POWER SWITCHING TRENCH MOSFET HAVING ALIGNED SOURCE REGIONS

BACKGROUND OF THE INVENTION

The present invention relates, in general, to semiconductor devices and, more particularly, to power Metal Oxide Semiconductor Field Effect Transistors (MOSFETs).

Power MOSFETs have been used in applications requiring high currents and high blocking voltages. Power MOSFETs provide a fast current switching response, a high input impedance, and high thermal stability and are applicable in systems such as Direct Current (DC) converters, motor control circuits, cellular phones, power supplies, and automotive switching circuits. A disadvantage of power MOSFETs is the on-resistance of the transistor that causes a drain-to-source voltage drop when the transistor is conducting high currents.

Efforts have been made to reduce the cell area of the power MOSFET and lower the on-resistance of the transistor. However, power MOSFETs having the gate and channel extending horizontally along the top surface of the semiconductor substrate are limited by the presence of a parasitic Junction Field Effect Transistor (JFET) between adjacent cells. The parasitic JFET increases the on-resistance of the power MOSFET as the device structure is scaled to smaller cell sizes.

To avoid this limitation inherent in the structure of the horizontal power MOSFET, a gate and conduction channel are formed vertically along a trench etched in the semiconductor substrate. The vertical orientation of the trench allows scaling of the gate and channel to reduced sizes without the effects of the parasitic JFET. Thus, the vertical orientation of the power MOSFET reduces the on-resistance when the power MOSFET is in the conduction mode.

Accordingly, it would be advantageous to form a vertical power MOSFET using a fabrication method that uses existing lithography equipment and is easily and inexpensively manufactured. It would be of further advantage to provide a power transistor having a low on-resistance when the power MOSFET is in the conduction mode.

DETAILED DESCRIPTION OF THE DRAWINGS

Generally, the present invention provides self-aligned junctions in a trench power Metal Oxide Semiconductor Field Effect Transistor (MOSFET) device that can be fabricated having sub-micron features without using sub-micron lithography, and thereby reduce manufacturing costs.

Figure 1:
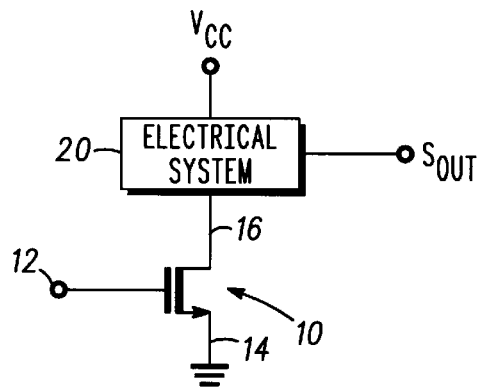
FIG. 1 is a schematic diagram of a power switching transistor providing current to an electrical system.

FIG. 1 is a schematic diagram of a power switching transistor 10 that switches or controls the current at an input of an electrical system 20. Power switching transistor 10 is also referred to as a semiconductor device and is a MOSFET having three accessible external terminals, i.e., a gate terminal 12, a source terminal 14, and a drain terminal 16.

For an N-channel MOSFET, the source terminal of power switching transistor 10 is typically connected to a power supply conductor such as ground and the drain terminal is coupled via electrical system 20 to a power supply conductor such as VCC. Alternatively, for a P-channel MOSFET (not shown), the source terminal of power switching transistor 10 is typically connected to a power supply conductor such as VCC and the drain terminal is coupled via electrical system 20 to a power supply conductor such as ground. In addition, an Insulated Gate Bipolar Transistor (IGBT) can be manufactured by selecting the appropriate conductivity for the support material 22. A control signal applied at gate terminal 12 generates a power switching signal at drain terminal 16 of power switching transistor 10. An output signal $S_{OUT}$ provides specific functions in accordance with the use of power switching transistor 10 and electrical system 20 in applications such as Direct Current (DC) converters, power supplies, motor control circuits, cellular phones, and automotive switching circuits.

Figure 2:
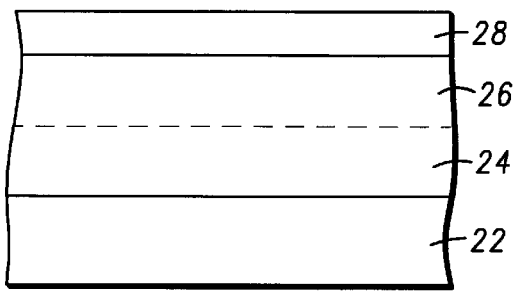
FIG. 2 is a cross-sectional view of a portion of a substrate on which beginning layers have been formed for the power switching transistor of FIG. 1.

FIG. 2 is a cross-sectional view of a portion of a semiconductor support material 22 or substrate on which beginning layers have been formed in the manufacture of power switching transistor 10 of FIG. 1. By way of example, N-channel enhancement devices are described herein, but those skilled in the art will recognize that substitutions of dopant types, materials and processes can be made to the following described method while remaining within the scope of the present invention. For example, P-channel devices can also be formed using the present invention with appropriate changes in dopant conductivity types. It should be noted that the same reference numbers are used in the figures to denote the same elements.

Support material 22 is provided and doped to have an N-type conductivity. Typically for a low voltage power MOSFET operating at less than about 60 volts, a 3 to 10 micrometer (um) thick N-type epitaxial layer 24 is formed on support material 22 and doped to a concentration of about $3 \times 10^{16}$ atoms per cubic centimeter ($cm^{-3}$). Body layer 26 is a semiconductor region or conduction region having a conductivity of P-type formed either by implantation and diffused into epitaxial layer 24 to a depth of about 0.9 um or by deposition of an 0.8–1.0 um P-epitaxial layer atop epitaxial layer 24. A field oxide layer 28 has a thickness of about 0.4 to 1.0 um that is deposited or grown over body layer 26.

Figure 3:
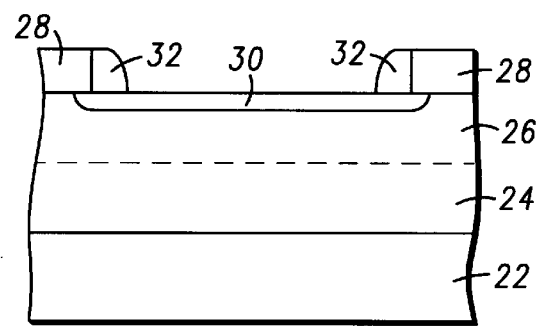
FIG. 3 is a cross-sectional view that shows the further steps of patterning an oxide definition layer.

FIG. 3 is a cross-sectional view that shows the further steps of patterning field oxide layer 28 on the upper surface of body layer 26. In a manufacturing step of power switching transistor 10, a photoresist pattern (not shown), i.e., a first masking layer, is formed on field oxide layer 28. The first photoresist pattern protects portions of field oxide layer 28 and defines other portions of body layer 26 where N-type source region 30 will be formed. An etching step removes a portion of field oxide layer 28 that is between edges 28A and 28B. Preferably, the surface of body layer 26 is not exposed and a thin layer of oxide remains on the surface of body layer 26 between edges 28A and 28B.

Source region 30 is a semiconductor region or conduction region that is either implanted or doped with an impurity to achieve a conductivity type. In other words, source region 30 is formed from an N-type dopant that is implanted through the opening in field oxide layer 28 that extends from edge 28A to edge 28B. The photoresist is then removed to allow further processing. Following an anneal process, source region 30 in body layer 26 spreads outside edges 28A and 28B, i.e., an area that is larger than the opening in field oxide layer 28. Preferably, source region 30 extends beyond edges 28A and 28B by a distance of about 0.1 to 0.3 um. A layer of nitride is deposited atop field oxide layer 28 and etched to form sidewall spacers 32. Sidewall spacers 32 are bounded laterally by edges 28A and 28B of field oxide layer 28 and extend inward from edges 28A and 28B by a distance of about 0.2 to 0.6 um.

Figure 4:
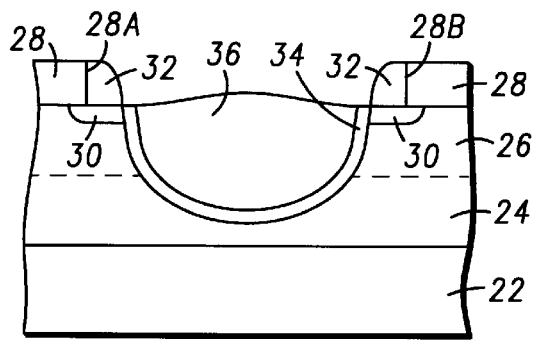
FIG. 4 is a cross-sectional view that shows the further steps of forming a trench.

FIG. 4 is a cross-sectional view that shows the further steps of forming a trench through body layer 26 and into epitaxial layer 24 in an area between sidewall spacers 32. A trench is formed from a surface of source region 30 and extends through body layer 26. The trench is centered in source region 30, i.e., a conduction region, between sidewall spacers 32. An anisotropic Reactive Ion Etch (RIE) uses sidewall spacers 32 as a mask in forming the trench. A sacrificial oxide is removed and a gate oxidation layer 34 is grown having a thickness of about 200 to 600 angstroms that covers the exposed portions of body layer 26 and epitaxial layer 24 in the trench. Both the high temperature sacrificial gate oxidation and the gate oxidation can be used to spread source region 30 beyond the outside edges 28A and 28B. It should be noted that the elements illustrated in the figures are not drawn to scale.

A conductive gate material 36 fills the control region that is formed in the trench of power switching transistor 10, i.e., the remaining portion of the trench. The control region is coupled for receiving a control signal. By way of example, conductive gate material 36 is an insitu doped polysilicon material that is deposited over surfaces of field oxide layer 28, sidewall spacer 32, and gate oxidation layer 34 and then etched to allow conductive gate material 36 to fill the trench. Alternatively, conductive gate material 36 can be a silicide or a metal. Preferably, an oxide is grown that covers the top portion of conductive gate material 36.

Figure 5:
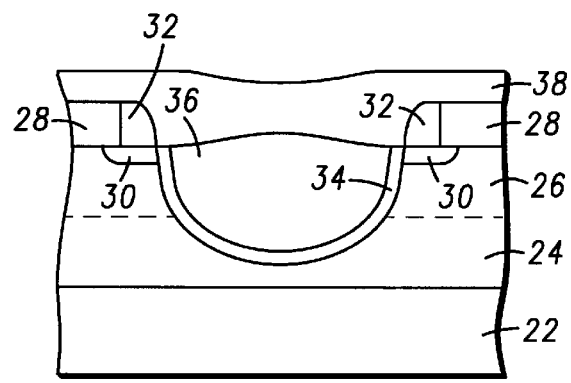
FIG. 5 is a cross-sectional view that shows the further step of depositing a second nitride layer.

FIG. 5 is a cross-sectional view that shows the further step of depositing a second nitride layer 38. Nitride layer 38 is deposited over surfaces of field oxide layer 28, sidewall spacer 32, and conductive gate material 36. Second nitride layer 38 and sidewall spacers 32 are a multi-layered insulating material that combine to form a homogeneous region. It should be noted that the materials used for field oxide layer 28 are interchangeable with the materials used for spacers 32 and second nitride layer 38. In other words, field oxide layer 28 could be a nitride layer and spacers 32 and second nitride layer 38 could both be an oxide layer.

Figure 6:
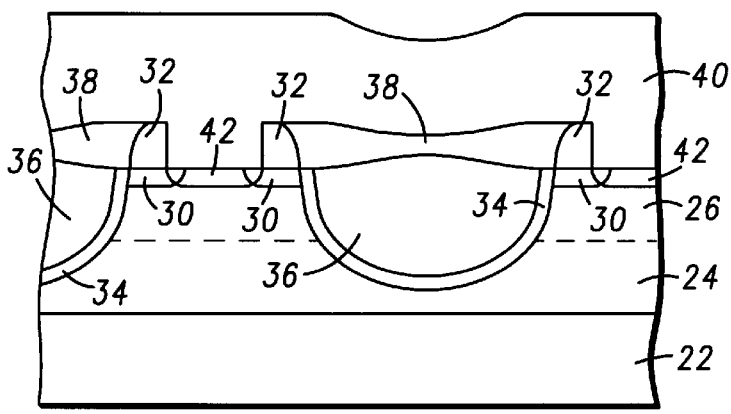
FIG. 6 is a cross-sectional view that shows the further steps of etching the second nitride layer and forming a metal layer.

FIG. 6 is a cross-sectional view that shows the further steps of etching the second nitride layer and forming an interconnect layer 40. The second nitride layer 38 is plasma etched and fills the area above conductive gate material 36 between sidewall spacers 32. In other words, second nitride layer 38 forms with sidewall spacers 32 to extend laterally from edge 28A to edge 28B and form a cap of nitride material that covers conductive gate material 36. The homogeneous region formed by nitride layer 38 and sidewall spacers 32 provide an isolating layer that prevents unwanted shorting of the interconnect layer 40 to conductive gate material 36. Thus, a multi-layered insulating material is formed by second nitride layer 38 and sidewall spacers 32.

A first layer formed by sidewall spacers 32 covers a portion of the semiconductor region, but not covering a portion of the trench. A second layer formed by nitride layer 38 covers the portion of the trench not covered by the first layer.

Oxide layer 28 over body region 26 is etched with an etch that is selective to nitride. A P-type implant layer 42 is formed in portions of body layer 26 not protected by nitride layer 38. Nitride layer 38 covers conductive gate material 36 and extends from edge 28A to edge 28B. Implant layer 42 is doped with boron to a concentration of about $1 \times 10^{19}$ atoms per cubic centimeter ($cm^{-3}$) and is self-aligned with edges 28A and 28B. A photoresist pattern (not shown), i.e., a second masking layer, is formed on second nitride layer 38. This second photoresist pattern protects portions of second nitride layer 38 and defines a portion of conductive gate material 36 where interconnect layer 40 forms an ohmic contact with conductive gate material 36. Nitride layer 38 and the protective oxide covering conductive gate material 36 are isotropically etched in the opening defined by the second masking layer. The photoresist pattern is removed.

An interconnect layer 40 is deposited atop nitride layer 38, portions of source region 30, and implant layer 42 and patterned using a photoresist pattern (not shown), i.e., a third masking layer. Suitable materials for interconnect layer 40 include metals or compounds such as aluminum, aluminum/ silicon, or other refractory metal compounds capable of forming an ohmic contact. It should be noted that interconnect layer 40 can be comprised of multiple layers of metal. Interconnect layer 40 is deposited at a thickness of approximately 4 microns.

Interconnect layer 40 is patterned to provide separate electrical conduction paths. A first portion of interconnect layer 40 forms an electrical conduction path providing contact to conductive gate material 36, i.e., gate terminal 12 of power switching transistor 10 (FIG. 1). A second portion of interconnect layer 40 forms an electrical conduction path providing contact to source region 30, i.e., source terminal 14 (FIG. 1) and to implant layer 42. It should be noted that interconnect layer 40 forms an ohmic contact with both source region 30 and implant layer 42. In addition, back metal (not shown) is deposited on a bottom surface of support material 22 and provides an electrical contact to support material 22, i.e., drain terminal 16 (FIG. 1) of power switching transistor 10.

In operation, a first voltage applied from drain terminal 16 to source terminal 14 (FIG. 1) and a second voltage applied from gate terminal 12 to source terminal 14 provide a conduction channel region within body layer 26 and epitaxial layer 24 adjacent gate oxidation layer 34. A current flows vertically through the channel region in body layer 26 adjacent the trench. An unwanted parasitic bipolar transistor having body layer 26 as the base, source region 30 as the emitter, and epitaxial layer 24 as the collector is formed in-between adjacent sections. Implant layer 42 covers the upper surface of body layer 26 between the adjacent sections that form power switching transistor 10. By forming P-type implant layer 42 in body layer 26, the beta (β) of the parasitic bipolar transistor is lowered.

Typically, power switching transistor 10 is fabricated having a plurality of fingers or sections. Each section has source regions 30 on both sides of conductive gate material 36. In other words, FIG. 6 illustrates the structure of a section and a portion of an adjacent section that comprise power switching transistor 10. Thus, power switching transistor 10 has conductive gate material 36 from each section commonly connected to form gate terminal 12 (FIG. 1), source regions 30 from each section commonly connected to form source terminal 14 (FIG. 1), and common epitaxial layers 24 from each section that form drain terminal 16 (FIG. 1).

By self-aligning implant layer 42 to source region 30 adjacent sections of power switching transistor 10 are spaced closer to one another. It should be noted that source regions 30 are implanted into body layer 26 by implanting with respect to edges 28A and 28B. It should be further noted that implant layers 42 are implanted into body layer 26 adjacent to source regions 30 by also implanting implant layers 42 with respect to edges 28A and 28B. Thus, by implanting both implant layer 42 and source region 30 with respect to edges 28A and 28B, implant layer 42 is self-aligned to source region 30. The self-alignment of implant layer 42 to source region 30 allows one source region 30 of one section of power switching transistor 10 to be spaced closer to an adjacent source region 30 of the next section and thereby increase the number of sections in power switching transistor 10. With more sections the channel width of power switching transistor 10 is increased which lowers the on-resistance of the transistor. The second portion of interconnect layer 40 commonly connects source regions, 30 and implant layers 42 for all of the sections comprising power switching transistor 10.

Figure 7:
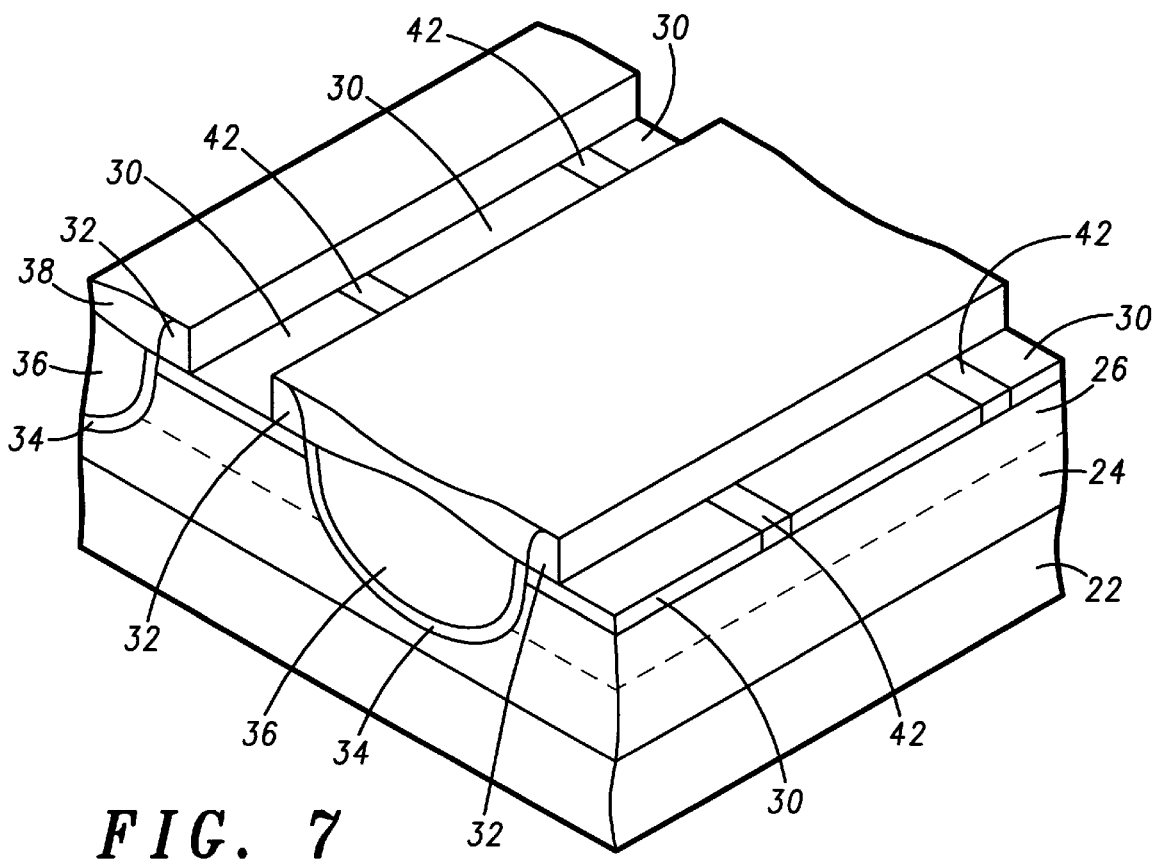
FIG. 7 is a perspective cross-sectional view of another embodiment of power switching transistor showing segmented source regions.

FIG. 7 is a perspective cross-sectional view of another embodiment of power switching transistor 10 showing segmented source regions 30. For ease of illustration interconnect layer 40 is not shown in this embodiment. Support material 22 is provided and doped to have an N-type conductivity. An N-type epitaxial layer 24 is formed on support material 22. Body layer 26 is a semiconductor region or conduction region having a conductivity of P-type atop epitaxial layer 24. In this embodiment, an additional masking layer provides a plurality of source regions 30. In other words, the additional masking layer provides segmented source regions 30 that are separated by thin bands or strips. The thin bands of body layer 26 are perpendicular to the trench that is formed in a later processing step. The masking layer over the thin bands protects portions of body layer 26 from receiving an N-type blanket implant into body layer 26 that forms source regions 30. Thus, source regions 30 are formed as a plurality of rectangular shaped regions that are separated by thin bands of body layer 26. The photoresist is then removed to allow further processing.

Briefly referring to FIG. 3, a field oxide layer 28 is deposited or grown over body layer 26 and source regions 30. As hereinbefore mentioned, a photoresist pattern is formed on field oxide layer 28 and an etching step removes a portion of field oxide layer 28 to expose portions of the thin bands and portions of source regions 30. The further steps of forming sidewall spacers 32, the trench, conductive gate material 36, a second nitride layer 38, and interconnect layer 40 have been hereinbefore described. It should be noted that implant layer 42 is formed in the remaining portions of the thin bands of body layer 26 that separate source regions 30 that were not removed in forming the trench. A P-type impurity material having a concentration of about $1\times10^{16}$ atoms per $cm^{-3}$ is blanket implanted to enhance the conductivity of the thin bands of body layer 26 and form the regions of implant layer 42.

Interconnect layer 40 (FIG. 6) provides an ohmic contact to source regions 30 and implant layer 42. An advantage of this embodiment is that adjacent trench regions can be formed close to each other. The on-resistance is reduced due to the additional sections and improved width of the channel provided by power switching transistor 10. An additional advantage of this embodiment is that interconnect layer 40 provides an electrical path connecting substantial surface areas of source region 30 with implant layer 42.

By now it should be appreciated that the present invention provides a self-aligned trench power switching transistor 10 that can be fabricated having sub-micron features without using sub-micron lithography. For instance, the opening in the field oxide layer 28 may be about one micron. The source regions 30 are aligned to the edges 28A and 28B of the field oxide layer 28 by implanting the source region 30 through the opening in the field oxide layer 28. Then sidewall spacers 32 are formed in accordance with edges 28A and 28B of the field oxide layer 28 and the trench is formed with respect to the sidewall spacers 32. Thus, the trench formed in the body layer 26 can have a feature size of less than one micron. The trench is formed centered within the source region 30, i.e., the reactive ion etch forms the trench such that the remaining source regions 30 on either side of conductive gate material 36 of power switching transistor 10 are self-aligned to conductive gate material 36 and substantially equivalent in area.

Power switching transistor is fabricated having a plurality of sections or commonly connected gate regions with source regions on both sides of the gate regions. The power switching transistor 10 provides a further advantage in that a source region of one section is closer to a source region of an adjacent section of power switching transistor 10. Implant layer 42 is formed in body layer 26 using edges 28A and 28B and self-aligned to source regions 30. Because the p-type implant layer 42 is self-aligned to source regions 30, source regions 30 associated with adjacent sections of power switching transistor 10 are closer together and the on-resistance associated with source regions 30 is reduced in power switching transistor 10.

Power switching transistor 10 provides yet a further advantage in that only three masking steps are used in the manufacturing process. The first masking step defines the opening in field oxide layer 28 which defines both the source region 30 and the gate of power switching transistor 10. The second masking step defines the via or opening in nitride layer 38 for forming contact from top-side interconnect layer 40 to conductive gate material 36. The third masking step patterns interconnect layer 40 to provide electrical contact to the terminals of power switching transistor 10. A fourth optional masking step may be used to pattern a passivation layer (not shown) that covers power switching transistor 10.

We claim:

1. A method of forming a semiconductor device, comprising the steps of:

providing a first semiconductor region of a first conductivity type;

providing a patterned oxide layer over the first semiconductor region;

forming a second semiconductor region of a second conductivity type in the first semiconductor region and aligned to an opening in the patterned oxide layer;

forming a first insulating layer aligned to the opening in the patterned oxide layer;

centering a trench within the second semiconductor region, wherein the trench extends from a surface of the second semiconductor region through the first and second semiconductor regions and the trench is aligned to the first insulating layer;

filling the trench with a conductive material;

covering the conductive material with a second insulating layer;

removing the oxide layer to expose an edge of the first insulating layer; and aligning an implant layer to the edge of the first insulating layer, where the implant layer is disposed in the first semiconductor region adjacent to the second semiconductor region.

2. The method of claim 1, wherein forming a first insulating layer includes forming a spacer.

3. The method of claim 1, wherein the implant layer further comprises enhancing the conductivity of a portion of the first semiconductor region adjacent the second semiconductor region.

4. A method of forming a power switching transistor, comprising the steps of:

providing a substrate;

forming a first conduction region in the substrate;

forming a second conduction region within the first conduction region;

forming a trench from a surface of the second conduction region and extending through the first and second conduction regions;

forming a control region in the trench; and forming a multi-layered insulating material having a first layer that covers a portion of the second semiconductor region but not covering a portion of the trench and a second layer covering the portion of the trench not covered by the first layer.

5. The method of claim 4, further including the step of using the multi-layered insulating material to mask the second conduction region in forming a third conduction region adjacent to the second conduction region.

6. The method of claim 5, further including the step of connecting the second conduction region and third conduction region with a metal.

7. A method of forming a power switching transistor, comprising the steps of:

providing a first semiconductor region of a first conductivity type;

forming a plurality of source regions in the first semiconductor region, where each source region is separated from an adjacent source region by a band of the first semiconductor region;

providing a patterned first insulating layer over the source regions and bands of the first semiconductor region;

forming spacers along an edge of the patterned first insulating layer;

aligning a trench to the spacers and intersecting a portion of the plurality of source regions, where the trench extends through the plurality of source regions;

filling the trench with a conductive material;

covering the conductive material with a second insulating layer; and implanting the band of the first semiconductor region with a first conductivity type.

* * * * *